(12) United States Patent
Yang et al.

(10) Patent No.: US 7,861,200 B2
(45) Date of Patent: Dec. 28, 2010

(54) SETUP AND HOLD TIME CHARACTERIZATION DEVICE AND METHOD

(75) Inventors: Yifeng Yang, Chandler, AZ (US); Yun Zhang, Gilbert, AZ (US); Yibin Xia, Gilbert, AZ (US); David J. Chapman, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 334 days.

(21) Appl. No.: 12/054,015

(22) Filed: Mar. 24, 2008

(65) Prior Publication Data

US 2009/0241080 A1  Sep. 24, 2009

(51) Int. Cl.
*G06F 17/50* (2006.01)

(52) U.S. Cl. .................. 716/6; 716/1; 716/4; 716/5; 716/8; 703/13; 703/14; 703/15

(58) Field of Classification Search .............. 716/1, 716/4, 5, 6, 8; 703/13, 14, 15
See application file for complete search history.

(56) References Cited

U.S. PATENT DOCUMENTS

| | | | | |
|---|---|---|---|---|
| 6,249,901 | B1* | 6/2001 | Yuan et al. | 716/5 |
| 6,374,393 | B1* | 4/2002 | Hirairi | 716/8 |
| 6,397,374 | B1* | 5/2002 | Pasqualini | 716/8 |
| 6,640,330 | B1 | 10/2003 | Joshi | |
| 6,854,102 | B1 | 2/2005 | Maheshwari | |
| 6,904,579 | B2 | 6/2005 | Katla et al. | |
| 6,990,646 | B2* | 1/2006 | Yoshikawa | 716/6 |
| 7,231,336 | B2* | 6/2007 | Wei et al. | 703/15 |
| 7,296,246 | B1* | 11/2007 | Kuehlmann et al. | 716/2 |
| 7,421,675 | B1* | 9/2008 | Campbell et al. | 716/6 |
| 7,437,696 | B2* | 10/2008 | Koch et al. | 716/6 |
| 7,451,417 | B1* | 11/2008 | Campbell et al. | 716/6 |
| 7,506,293 | B2* | 3/2009 | Dasdan et al. | 716/6 |
| 7,512,920 | B2* | 3/2009 | Yoshikawa | 716/6 |
| 2009/0119631 | A1* | 5/2009 | Cortadella et al. | 716/6 |

* cited by examiner

*Primary Examiner*—Helen Rossoshek

(57) ABSTRACT

A method of characterizing a device under test (DUT) includes determining a goal function associated with a setup and hold time for the DUT. A minimum value for the goal function is determined by iteratively adjusting setup and hold times for input data to the DUT, and determining whether the DUT performs according to specifications. The minimum goal function value will reflect minimum setup and hold time values based on weights associated with the goal function. This allows the minimum setup and hold times for the DUT to be characterized with a small number of binary searches, improving the speed of the characterization process.

20 Claims, 5 Drawing Sheets

US 7,861,200 B2

SETUP AND HOLD TIME CHARACTERIZATION DEVICE AND METHOD

FIELD OF THE DISCLOSURE

The present disclosure relates to the design of integrated circuit devices and more particularly to characterization of setup and hold times for integrated circuit devices.

BACKGROUND

Due to the complexity of integrated circuit devices, software tools are typically employed in the design process for an integrated circuit device. The software tools utilize design cells, representing functional models of logic elements of the integrated circuit design, to model the behavior of a particular design. Such design cells can represent sequential elements, combinational elements, and combinations thereof. It is sometimes desirable for the design cell to represent timing information, such as setup and hold time information, for the associated logic element. Such timing information can be helpful in determining the maximum operating frequency for the integrated circuit design. Accordingly, it is typically desirable to characterize the setup and hold time for a design cell.

However, conventional methods of characterizing setup and hold times can be undesirably time consuming. For example, one such characterization method involves repeatedly executing a number of binary searches. In particular, the characterization method requires selecting an initial hold or setup time (referred to as the constraint time) and testing the design cell by applying input data to the cell having the constraint time. A binary search is performed by iteratively dividing the setup or hold time (referred to as the tested time) of the input data in half and applying the input data to the design cell until the minimum tested time that allows the design cell to perform according to specifications is determined. The constraint time is then adjusted and the minimum tested time for the adjusted constraint time is determined using a binary search. The derivative of the line defined by the two determined constraint and tested times is determined, and, if it is above a specified threshold, the constraint time is again adjusted and a binary search performed to determine the associated minimum tested time. The process is repeated until the derivative for the curve defined by the determined points is below the specified threshold. However, this method can take an undesirable amount of time, as each binary search can require numerous iterations. Accordingly, an improved method of characterizing the setup and hold time of a device would be useful.

DETAILED DESCRIPTION

A method of characterizing a device under test (DUT) includes determining a goal function associated with a setup and hold time for the DUT. A minimum value for the goal function is determined by iteratively adjusting setup and hold times for input data to the DUT, and determining whether the DUT performs according to specifications. The minimum goal function value will reflect minimum setup and hold time values based on weights associated with the goal function. This allows the minimum setup and hold times for the DUT to be characterized with a small number of binary searches, improving the speed of the characterization process.

As used herein, the term "goal function" refers to a weighted combination of setup and hold times for a device under test. The goal function can be expressed as follows:

$$GF = W_S * \text{Setup} + W_h * \text{Hold}$$

where $W_S$ is the relative weight for the setup time, $W_h$ is the relative weight for the hold time, and GF indicates the goal function value. In addition, as used herein, the term "minimum goal function value" refers to the minimum goal function value associated with setup and hold times that permit a device under test to operate in a specified manner.

Figure 1:
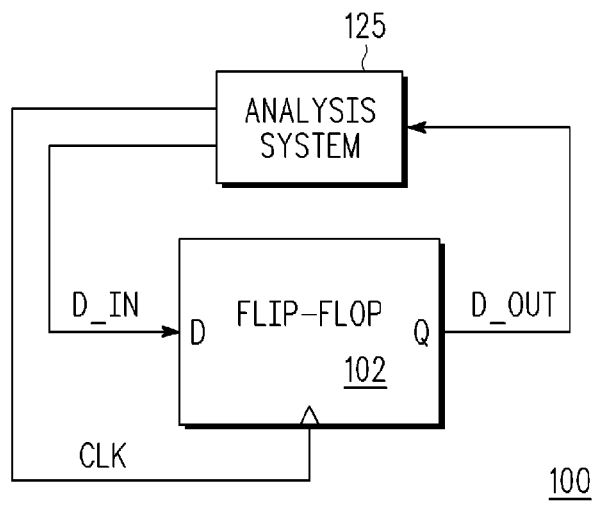
FIG. 1 is a block diagram of a particular embodiment of testing system for a flip-flop in accordance with one embodiment of the present disclosure.

FIG. 1 illustrates a block diagram of a particular embodiment testing system 100 including a flip-flop 102 and an analysis system 125. The flip flop 102 includes an input, labeled "D", to receive an input signal D_IN, an output labeled "Q" to provide an output signal labeled D_OUT, and a clock input to receive a clock signal labeled "CLK." The analysis system 125 includes outputs to provide the D_IN and CLK signals, and an input to receive the signal D_OUT. It will be appreciated that although for purposes of discussion the flip-flop 102 and the analysis system are illustrated as physical devices having physical connections, in an embodiment the flip-flop 102 is a design cell representing operation of a physical flip-flop, and the analysis system 125 is a software module configured to simulate operation of the physical flip-flop based on the design cell.

The flip-flop 102 is configured to provide data received at the input D at the output Q in response to a triggering edge (e.g. a rising or falling edge) of the clock signal CLK. In order for the flip-flop 102 to operate in a synchronous manner, so that the state of the input signal D_IN is reliably and accurately provided as data at the output, the data signal D_IN must satisfy the minimum setup and hold times of the flip-flop 102. As used herein, the setup time refers to the amount of time before the triggering clock edge that the data signal D_IN is stable. The minimum setup time is the minimum amount of time before the triggering edge clock signal that the data signal D_IN must be stable to guarantee that the signal will be properly applied to a logic element such as the flip-flop 102 signal. Hold time refers to the amount of time after the clock edge that the state of the data signal D_IN is held in that state. The minimum hold time refers to the minimum amount of time that the data signal D_IN must be held in order to ensure that the data is properly applied to the flip-flop 102. For purposes of discussion herein, the setup and hold time for a device under test are each individually referred to as a timing parameter. Thus, a timing parameter value refers to a value associated with that timing parameter (setup time or hold time).

The analysis system 125 is configured to test setup and hold times for the flip-flop 102. In particular, to test a particular setup and hold time, the analysis system 125 provides the signal D_IN and the CLK clock signal, ensuring that the signal D_IN has the requisite setup and hold times relative to a triggering edge of the CLK clock signal. The analysis system then compares the state of the D_OUT signal to an expected state. Failure of the D_OUT signal to match the expected state results in a failed test.

Logic elements, and the design cells associated therewith, can be characterized by their minimum setup and minimum hold times. However, for some elements and in some integrated circuit designs the setup and hold time for the element can have different relative importance. Accordingly, it can be useful to characterize the element with a goal function associated with the setup and hold time. By minimizing the goal function value, the setup and hold times are minimized according to their relative weights. The logic element can thus be characterized by the setup and hold time values that result in the minimization of the goal function value, or by the minimum goal function value itself. This allows logic elements to be characterized based on the relative weights of the setup and hold times for the logic element design.

The analysis system 125 can determine the minimum goal function value associated with the flip-flop 102 by first determining initial values for the setup and hold times, determining an initial goal function value. Next the goal function value is varied, and the flip-flop 120 is tested using the setup and hold times associated goal function value, until the flip-flop 120 fails to operate as specified (e.g. fails to provide an expected state of D_OUT at an expected time). This process can be better understood with reference to FIGS. 2-5.

Figure 2:
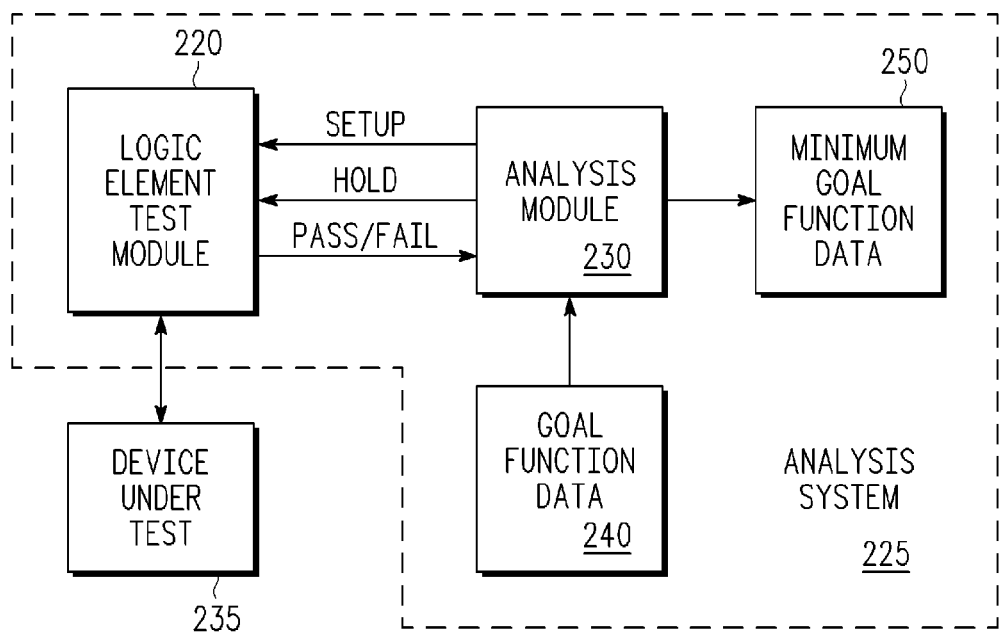
FIG. 2 is a block diagram of a system for determining the setup and hold time for a design cell in accordance with one embodiment of the present disclosure.

FIG. 2 illustrates a block diagram of a system 200 for determining a minimum goal function value for a design cell associated with a logic element. It will be appreciated that one or more modules of the system 200 can be implemented as software executing on a computer. The system 200 includes an analysis system 225, corresponding to the analysis system 125 of FIG. 1. The analysis system 225 includes a logic element test module 220, a device under test (DUT) 235, an analysis module 230, global function data 240, and minimum goal function data 250.

The DUT 235 represents a logic element of an integrated circuit design. Accordingly, the DUT 235 can be a physical device, or a data file that reflects the behavior of the associated logic element. In this case, the DUT 235 includes information representing the functional behavior of the logic element. Logic elements that can be represented by the DUT 235 include a flip-flop, latch, and the like, or any combination thereof.

The logic element test module 220 is configured to receive setup and hold time parameters, labeled SETUP and HOLD, respectively, and to test the DUT 235 based on the received parameters. In particular, the logic element test module 220 is configured to determine the behavior of a logic element based on the DUT 235 and to determine, based on the determined behavior, whether logic element will perform according to specifications based on the received SETUP and HOLD parameters. For example, the logic element test module 220 can apply input values and a clock signal to the DUT 235, and control the timing of changes in the input values to correspond to the timing of the SETUP and HOLD parameters. The logic element test module 220 can be further configured to determine whether the test cell provides expected output values and provide information, labeled PASS/FAIL, as to whether the expected output values were detected. As used herein, a passed test refers to a test of the DUT 235 that results in the device performing according to specifications, while a failed test refers to a test of the DUT that results in the device failing to perform according to specifications.

The analysis module 230 is configured to access the global function data 240 to determine the relative weights $W_S$ and $W_H$ for a goal function, and to determine a minimum value for the goal function based on the weights. In particular, the analysis module 230 is configured to iteratively determine setup and hold time values and provide those values to the logic element test module 220 as the values SETUP and HOLD for testing. Based on whether particular SETUP and HOLD values result in a passed or failed test, the analysis module 230 determines a minimum value for the goal function and records this minimum value at the minimum goal function data 250.

Figure 3:
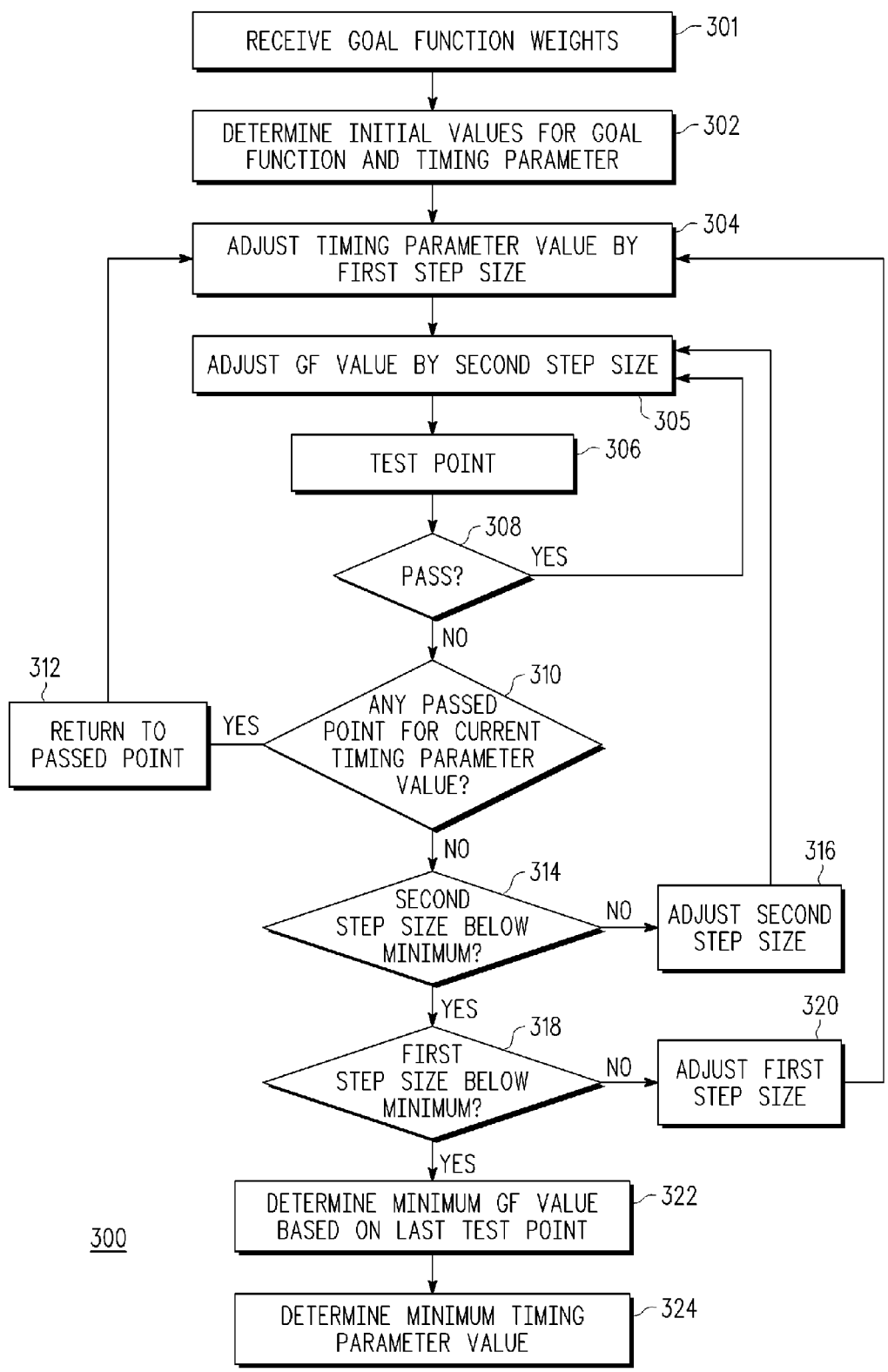
FIG. 3 is a flow diagram of a method of determining the minimum value for a goal function associated with the setup and hold time of a device under test in accordance with one embodiment of the present disclosure.

The operation of the system 200 can be better understood with reference to FIG. 3, which illustrates a flow diagram of a particular embodiment of a method 300 of determining a minimum value for a goal function associated with a device under test. At block 301, the analysis module 230 receives weights associated with a goal function by accessing the goal function data 240. At block 302, the analysis module 230 determines initial values for the goal function and a selected timing parameter. In an embodiment, the analysis module 230 selects the timing parameter based on the received weights for the goal function. For example, in one embodiment, if the weight associated with the hold time of the device under test is greater than the weight associated with the setup up, the analysis module 230 will select the hold time as the timing parameter for the method 300.

At block 304, the analysis module 230 adjusts the timing parameter value by a first step size and, at block 305, adjusts the goal function value by a second step size. At block 306, the analysis module 230 determines a setup time value and hold time value based on the current goal function value. This setup time value and hold time value pair is referred to as a test point. The analysis module 230 provides the setup time value and hold time value associated with the test point to the logic element test module 220, which tests the device under test 235 based on the received values. In particular, the logic element test module 220 applies an input to the device under test having a setup time and hold time based on the received values. The logic element test module 220 compares an output resulting from the applied input, and indicates a PASS if the output complies with a specified output. If the output does not match the specified output, the logic element test module 220 indicates a FAIL.

At block 308, the analysis module 230 determines whether the logic element test module 220 has indicated a PASS or FAIL test result. In response to a PASS, the method flow returns to block 305 and the analysis module 230 again adjusts the goal function value. Thus, the analysis module 230 iteratively adjusts the test point (by adjusting the goal function value) until the logic element test module indicates a FAIL result.

In response to a FAIL at block 308, the method flow proceeds to block 310 and the analysis module 230 determines whether there was a previous test point for the current timing parameter value that resulted in a passed test. If so, at block 312 the analysis module 230 returns to the test point. That is, the analysis module 230 determines the goal function and timing parameter values associated with the most recent test point that resulted in a passed test. The method flow returns to block 304 where the timing parameter value is again adjusted.

In response to determining, at block 310, that there is no previous test point for the current timing parameter value that resulted in a passed test, the method flow moves to block 314 and the analysis module 230 determines whether the second step size (associated with the goal function value) is below a minimum value. If not, the method flow moves to block 316 and the analysis module 230 adjusts the second step size. The method flow returns to block 305 to adjust the goal function value by the adjusted second step size. Accordingly, as the test point moves closer to a point associated with the minimum goal function value, the second step size is reduced, improving the resolution of the determination process.

If, at block 314, it is determined that the second step size is below the minimum value, the method flow moves to block 318 and the analysis module 230 determines whether the first step size (associated with the timing parameter value) is below a minimum value. If not, the method flow moves to block 316 and the analysis module 230 adjusts the second step size. The method flow returns to block 304. If, at block 318, it is determined that the first step size is below the minimum value, the method flow moves to block 322 and the analysis module 230 determines the minimum goal function value. In the illustrated embodiment, the minimum value is the goal function value associated with the last test point that resulted in a PASS result.

At block 324, the analysis module 230 determines the minimum timing parameter value associated with the minimum goal function value. In the illustrated embodiment, the minimum timing parameter value is the timing parameter value (setup time value or hold time value) associated with the last test point that resulted in a PASS. The minimum timing parameter value can be used to improve the efficiency with which the minimum goal function time is used. For example, in some testing configurations, the minimum goal function value and associated minimum timing parameter are used to determine a set of setup and hold time tables for the test. Further such testing configurations can require interpolation between setup or hold time values in the table. By using the minimum timing parameter associated with the minimum goal function value to create the setup and hold time tables, the likelihood that errors will result from the interpolation process is reduced.

Figure 4:
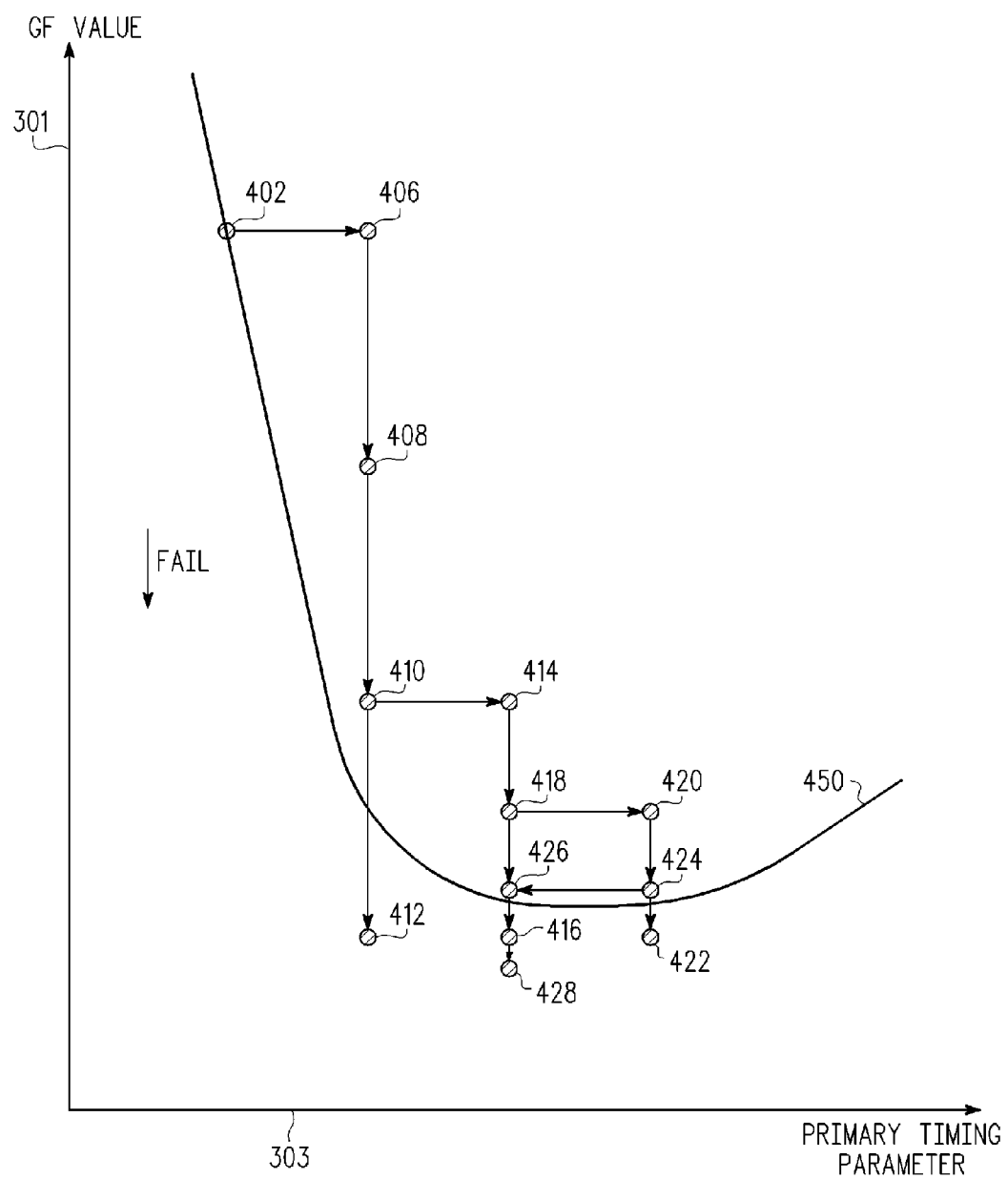
FIG. 4 is a diagram illustrating an exemplary method of determining the minimum value for a goal function associated with the setup and hold time of a device under test in accordance with one embodiment of the present disclosure.

FIG. 4 illustrates a diagram 400 showing, in pictorial form, application of a particular embodiment of the method 300. The y-axis 401 of the diagram 400 represents goal function values while the x-axis 403 represents values for a timing parameter (setup or hold time) associated with the device under test. The particular timing parameter represented by the x-axis depends on the relative weights associated with the goal function. In an embodiment, the timing parameter associated with the greater goal function weight is reflected by the x-axis. For purposes of discussion herein, the timing parameter represented by the x-axis is referred to as the primary timing parameter.

The diagram 400 illustrates a curve 450, which represents, for particular primary timing parameter values, the minimum goal function value that will result desired operation of the device under test. Accordingly, points located above curve 450 are associated with setup time values and hold time values that will result in a PASS test result at the logic element test module 230. Points located below the curve are associated with setup time values and hold time values that will result in a FAIL test result at the logic element test module 230. The diagram 400 also illustrates a number of points, including points 402, 404, 406, 408, 410, 412, 414, 416, 420, 424, 426, and 428 (points 402-428). Although for purposes of illustration points 402-428 are shown as large dots, each represents a single point of the diagram 400.

In operation, the analysis module 230 selects initial setup and hold time values. In an embodiment, these values are determined using a binary search process. The analysis module determines a goal function value and primary timing parameter value based on the selected initial setup and hold time values. These initial goal function and primary timing parameter values are represented as point 402 in the diagram 400.

To determine the minimum goal function value, the analysis module 230 adjusts the primary timing parameter value by a first specified step value to determine point 406. This point is not tested at the logic element test module 220. Instead, the analysis module 230 adjusts the goal function value by a second specified step size to determine point 408. The setup and hold time values reflected by point 408 are provided by the analysis module 230 to the logic element test module 220 for testing.

Because point 408 lies above the curve 450, the logic element test module 220 indicates a PASS result for the test. Accordingly, the analysis module 230 again adjusts the goal function value by the second step size to determine point 410, and provides the associated setup and hold time values to the logic element test module 230 for testing, which again indicates a PASS result. In response, the analysis module 230 adjusts the goal function value by the second step size to determine point 412. The analysis module 220 provides these values to the logic element test module 220 for testing, which returns a FAIL test result. In response, the analysis module 220 returns to the primary timing parameter value and goal function value represented by point 410, and adjusts the primary timing parameter value by the first step size to determine point 414.

The analysis module 230 further adjusts the goal function value by the second step size to determine point 416, and provides the associated setup and hold time values to the logic element test module 220 for testing. In response to the logic element test module returning a FAIL result, the analysis module 230 divides the second step size in half, and adjusts the goal function value by the adjusted step size to determine point 418. The analysis module 230 provides the setup and hold time value associated with this point to the logic element test module, which returns a PASS result. Accordingly, the analysis module 230 again adjusts the goal function value to arrive at point 416, and provides the associated setup and hold time values to the logic element test module 220, which returns a FAIL result. In response, the analysis module 230 returns to point 418 and adjusts the associated primary timing parameter value by the first step size to determine point 420.

The analysis module 230 adjusts the goal function value associated with point 420 by the second step size to determine point 422, and provides the associated hold time value and setup time value to the logic element test module 220 for testing. Because point 422 is located below curve 450, the logic element test module returns a FAIL result. The analysis module 230 determines that there is not a previous test point associated with the current primary timing parameter value, and accordingly reduces the second step size. In an embodiment, the analysis module reduces the first step size by dividing it in half.

The analysis module 230 adjusts the goal function value associated with point 420 based on the reduced second step size to determine point 424, provides the associated hold time value and setup time value to the logic element test module 220 for testing and receives a PASS test result in response. Accordingly, the analysis module 230 again adjusts the goal function value by the reduced second step size to determine point 422 and provides the setup time value and hold time value associated with the point to the logic module 220 for testing.

In response to the test returning a FAIL result, the analysis module 230 returns to point 424. Further, the analysis module 230 determines that the magnitude of the second step is below a threshold. Accordingly, the analysis module 230 subtracts the first step size from the primary timing parameter associated with point 424 to determine point 426, for which the logic element test module returns a PASS result. In response the analysis module adjusts the goal function value by the reduced second step size, to determine point 428. This point results in a FAIL test result. Accordingly, the analysis module compares the first and reduced second step sizes to threshold values. In the illustrated embodiment of FIG. 4, the step sizes are each less than the associated threshold value. Accordingly, the analysis module determines that point 426 is indicative of the minimum goal function value.

As illustrated, the analysis module 230 iteratively adjusts the magnitudes of the first and second step sizes in response to particular failed tests. In this way the analysis module 230 increases the resolution of the step size as it gets closer to the minimum goal function value. This improves the efficiency of the process, as the analysis module 230 is able to iterate tested values by large steps at the beginning of the process, resulting in fewer tested points. Further, in the illustrated example of FIG. 4, the analysis module 230 is able to determine the minimum goal function value with a reduced amount of binary searches relative to conventional methods. This allows the minimum goal function value to be determined more rapidly, improving the efficiency of the characterization process. In addition, the analysis module 230 determines the minimum timing parameter (setup or hold time) associated with the minimum goal function time.

Figure 5:
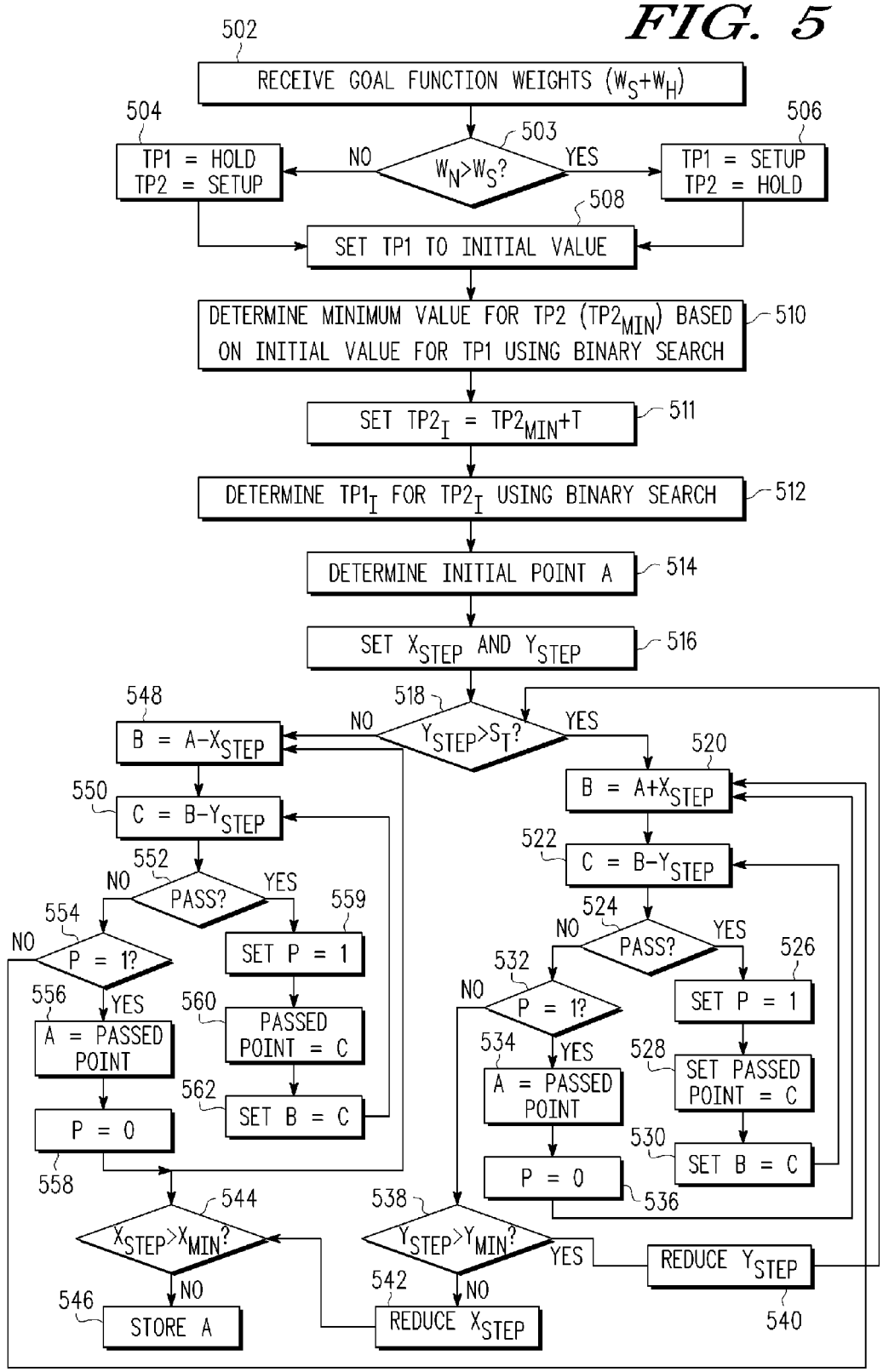
FIG. 5 illustrates a flow diagram of a method of determining the minimum of a goal function associated with the setup and hold time of a design cell in accordance with one embodiment of the present disclosure.

The operation of the analysis module 230 can be further understood with reference to FIG. 5, which illustrates a flow diagram of a particular embodiment of a method of determining a minimum goal function value for a device under test. At block 502, the goal function weights $W_S$ and $W_h$ are received from a data file, user input, or other source. At block 503, it is determined whether $W_h$ is greater than $W_S$. If so, the method proceeds to block 504 and first timing parameter (TP1) for the device under test is associated with the setup time while a second timing parameter (TP2) is associated with the hold time. If $W_h$ is not greater than $W_S$, the method flow moves to block 504 and the hold time is associated with TP1 and the setup time is associated with TP2. Thus, blocks 504 and 505 ensure that the timing parameter associated with the greater weight will be the parameter that is iteratively varied to determine the minimum goal function value. This timing parameter is referred to herein as the primary timing parameter.

From blocks 504 and 505, the method flow proceeds to block 506, where the timing parameter TP1 (i.e. either the setup or hold time) is set to an initial value. In an embodiment, this initial value is substantially the same as the length of one clock cycle for the device under test.

At block 508, a value for the timing parameter TP2 ($TP2_{MIN}$) associated with the initial TP1 parameter value is determined using a binary search. At block 510, a value $TP2_I$ is determined by adding a specified value (T) to $TP2_{MIN}$. In an embodiment, this value is less than or equal to 30 picoseconds. At block 512, a value for the TP1 parameter ($TP1_I$) associated with the $TP2_I$ value is determined using a binary search.

At block 520 goal function and primary timing parameter values are determined using the values for $TP1_I$ and $TP2_I$. These values represent an initial point, labeled A. At block 522 step sizes for the primary timing parameter ($X_{STEP}$) and goal function ($Y_{STEP}$) are determined. In an embodiment, these can be stored as part of the global function data 240. At block 518, it is determined whether $Y_{STEP}$ is greater than a step threshold ($S_T$). If so, this indicates that only a few additional iterations are likely to be needed before the minimum goal function is determined. Accordingly, the method flow moves to block 548 to begin determining the minimum value for the primary timing parameter associated with the minimum goal function value. If $Y_{STEP}$ is greater than $S_T$, the method flow proceeds to block 520. In a particular embodiment, $S_T$ is equal to 3.

At block 520, a point B is determined by adding $X_{STEP}$ to the primary timing parameter value of point A. At block 522, a point C is determined by subtracting $Y_{STEP}$ from the goal function value of point A. At block 524, the setup and hold time values reflected by point C are tested. If the test results in a pass (i.e. if the device under test performs according to specifications under the tested setup and hold times) the method flow proceeds to block 526 and a flag "P" is set to indicate that point C resulted in a passed test. At block 428, the point C is stored as a variable labeled PASSED POINT. At block 530, point B is set as point C, and the method returns to block 522 to continue varying the goal function value of the test point until a failed test is determined.

If, at block 524, the tested setup and hold times result in a failed test, the method moves to block 532 and it is determined whether the flag P is set. If the flag P is set, indicating a previous point resulted in a passed test, the method moves to block 534 and the point A is set to be the point stored as the PASSED POINT. At block 536 the flag P is cleared, and the method flow returns to block 524 to change the primary timing parameter value by the step value $X_{STEP}$.

If, at block 532, it is determined that the flag P is clear the method flow proceeds to block 538 and it is determined whether the value $Y_{STEP}$ is greater than a threshold value ($Y_{MIN}$). In one embodiment, the threshold $Y_{MIN}$ is equal to 1. If $Y_{STEP}$ is greater than $Y_{MIN}$, the method flow moves to block 540 and the value $Y_{STEP}$ is reduced. In an embodiment, the value $Y_{STEP}$ is reduced by dividing the value in half. The method flow returns to block 518. If, at block 538 the value $Y_{STEP}$ is below the threshold value $Y_{MIN}$, the method flow moves to block 542 and the $X_{STEP}$ value is reduced. In an embodiment, the $X_{STEP}$ value is reduced by dividing the value in half.

The method flow proceeds to block 544 and it is determined whether the $X_{STEP}$ value is greater than a threshold. In an embodiment, the threshold value for $X_{STEP}$ is equal to 1. In another embodiment, the threshold value for $Y_{STEP}$ is different than the threshold value for $X_{STEP}$. If, at block 544, it is determined that the value $X_{STEP}$ is below the threshold, this indicates that the minimum goal value, within the resolution represented by $Y_{STEP}$ and $X_{STEP}$, as well as the minimum primary timing parameter value associated with the minimum goal function value, is indicated by point A. Accordingly, at block 546, point A is stored. The stored value represents the characterized goal function value for the device under test, as well as the minimum primary timing parameter associated with the goal function value.

If at block 544, the value for $X_{STEP}$ is greater than $X_{MIN}$ this indicates that the minimum timing parameter value has not been located. Accordingly, the method flow proceeds to block 548, and point B is determined by subtracting $X_{STEP}$ from the primary timing parameter value associated with point A. At block 550, the point C is determined by subtracting $Y_{STEP}$ from the goal function value associated with point B. At block 552, the setup and hold time values associated with point C are tested at the device under test. In the event of a passed test, the method flow proceeds to block 559 and the flag P is set to 1. At block 560 the PASSED POINT variable is set to be equal to point C, and at block 562 point B is set to be equal to point C. The method flow returns to block 550 to continue adjustment of the goal function value under test.

If, at block 552, the test of the timing parameter values associated with point C results in a failed test, the method flow proceeds to block 554, and it is determined whether the flag P is set. If not, this indicates that there was not a passed test for the current value of the primary timing parameter, and therefore the current value does not reflect the minimum value of the primary timing parameter associated with the minimum goal function value. Accordingly, the method flow moves to block 520 in order for the primary timing parameter to be adjusted upwards.

If, at block 554, it is determined that the flag P is set, indicating a previously passed test for the current value of the primary timing parameter, the method flow moves to block 556, and the point A is set to the point stored as the PASSED POINT. At block 558, the flag P is cleared. The method flow returns to block 550 to adjust the primary timing parameter value. Accordingly, the primary timing parameter value is iteratively adjusted until the minimum value associated with the minimum goal function value is determined.

Figure 6:
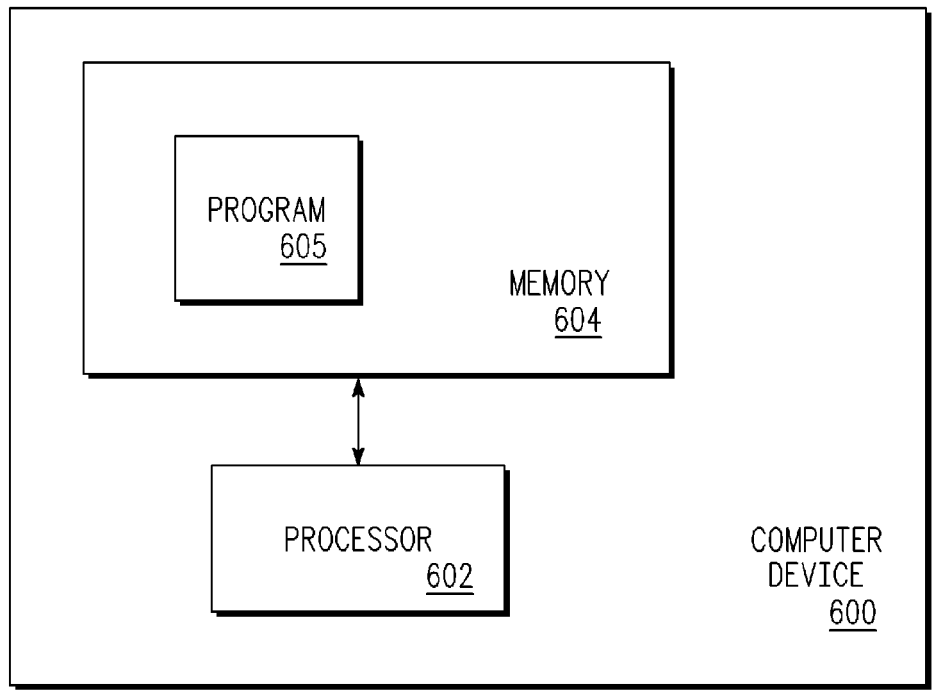
FIG. 6 is a block diagram of a computer system configured to execute one or more of the methods disclosed herein.

FIG. 6 illustrates a block diagram of a particular embodiment of a computer device 600. The workstation 600 includes a processor 602 and a memory 604. The memory 604 is accessible to the processor 602.

The processor 602 can be a microprocessor, controller, or other processor capable of executing a set of instructions. The memory 604 is a computer readable medium such as random access memory (RAM), non-volatile memory such as flash memory or a hard drive, and the like. The memory 604 stores a program 605 including a set of instructions to manipulate the processor 602 to perform one or more of the methods disclosed herein. For example, the program 605 can manipulate the processor 602 to determine the minimum goal function value for a device under test. The goal function, as well as the minimum goal function value or the setup and hold times associated with the goal function value can also be stored in the memory 604.

Figure 7:
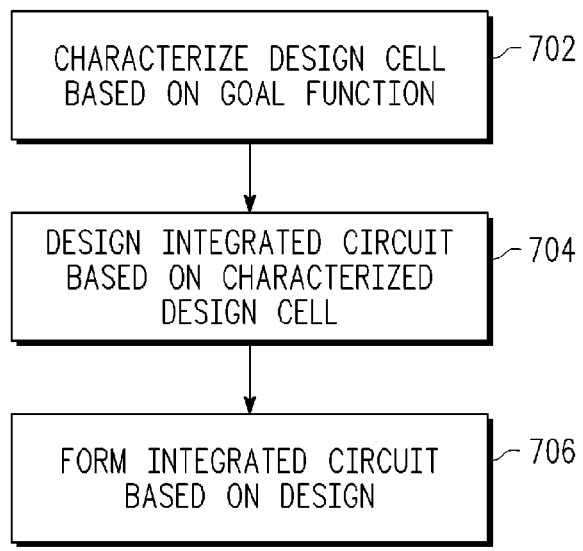
FIG. 7 is a flow diagram of a method of designing and forming an integrated circuit in accordance with one embodiment of the present disclosure.

FIG. 7 illustrates a flow diagram of a method of designing and forming an integrated circuit in accordance with one embodiment of the present disclosure. At block 702, a design cell of an integrated circuit is characterized based on a goal function. The design cell can be characterized using one or more as described herein, such as the method described respect to FIG. 3 or the method described with respect to FIG. 5. At block 704, an integrated circuit is designed based on the characterized design cell. For example, the integrated circuit can be designed so that the setup and hold times for the design cell, as reflected by the minimum goal function value, are satisfied for specified operation of the integrated circuit. At block 706, an integrated circuit is formed based on the design created at block 704.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
    receiving at a processor a first weight associated with a goal function having an adjustable goal function value, the first weight indicating a relative importance of a hold time of a device under test;
    receiving at the processor a second weight associated with the goal function, the second weight indicating a relative importance of a setup time of the device under test, the goal function comprising a sum of the first weight times the hold time and the second weight times the setup time; and
    determining at the processor a minimum value for the goal function by iteratively adjusting the goal function value and testing the device under test based on the goal function value.

2. The method of claim 1, further comprising:
    determining a minimum timing parameter value associated with the minimum goal function value, wherein the minimum timing parameter value is associated with one of the hold time and the setup time of the device under test.

3. The method of claim 1, wherein determining the minimum value for the goal function comprises:
    iteratively adjusting the goal function value by a first step size;
    applying an input to the device under test having a setup and hold time based on the goal function value;
    in response to determining that an output of the device under test based on the input does not match a specified output, adjusting a magnitude of the first step size.

4. The method of claim 3, wherein determining the minimum value of the goal function further comprises determining the minimum value based on the magnitude of the first step size.

5. The method of claim 3, wherein determining the minimum value for the goal function further comprises:
    iteratively adjusting a timing parameter value associated with the goal function value by a second step size, wherein the timing parameter value is associated with one of the setup time and the hold time associated with the device under test; and
    in response to determining that the output of the device under test based on the input does not match the specified output, adjusting a magnitude of the second step size.

6. The method of claim 5, wherein determining the minimum value for the goal function further comprises determining the minimum value based on the magnitude of the first step size and the magnitude of the second step size.

7. The method of claim 1, wherein determining the minimum value for the goal function comprises:
    associating a timing parameter with one of the hold time and the setup time of the device under test;
    determining a goal function value;
    determining a timing parameter value associated with the timing parameter;
    until a first step size is less than a first value and a second step size is less than a second value:
        adjusting the timing parameter value by the first step size;
        until a test result indicates a failed test:
            iteratively adjusting the goal function value by the second step size;
            testing the device under test based on the goal function value to produce the test result; and setting a first indicator and storing the goal function value and the timing parameter value in response to the test result indicating a passed test; and in response to the test result indicating a failed test:

in response to determining the first indicator is set, setting the timing parameter value to the stored timing parameter value, setting the goal function value to the stored goal function value, and clearing the first indicator; and in response to determining the first indicator is not set, adjusting one of the first step size and the second step size; and storing the goal function value in response to the first step size being less than the first value and the second step size being less than the second value, the stored goal function value representative of a minimum goal function value for the device under test.

8. The method of claim 7, wherein associating the timing parameter comprises associating the timing parameter with the hold time in response to determining the first weight is greater than the second weight, and wherein determining the timing parameter value comprises:

setting a first hold time value to an initial value;

determining a first setup time value based on the first hold time value;

adjusting the first setup time value to determine a second setup time value; and determining the timing parameter value based on the second setup time value.

9. The method of claim 8, wherein determining the first setup time value comprises determining the first setup time value based on a binary search, the binary search based on the first hold time value.

10. The method of claim 9, wherein determining the timing parameter value time comprises determining the timing parameter value based on a binary search, the binary search based on the second setup time value.

11. The method of claim 7, wherein associating the timing parameter comprises associating the timing parameter with the setup time in response to determining the first weight is less than the second weight, and wherein determining the timing parameter value comprises:

setting a first setup time value to an initial value;

determining a first hold time value based on the first setup time value;

adjusting the first hold time value to determine a second hold time value; and determining the timing parameter value based on the second hold time value.

12. The method of claim 11, wherein determining the first hold time value comprises determining the first hold time value based on a binary search, the binary search based on the first setup time value.

13. The method of claim 11, wherein determining the timing parameter value time comprises determining the timing parameter value based on a binary search, the binary search based on the second hold time value.

14. The method of claim 7, wherein adjusting the timing parameter value comprises adding the first step size to the timing parameter value.

15. The method of claim 7, wherein adjusting the timing parameter value comprises subtracting the first step size from the timing parameter value.

16. The method of claim 1, further comprising:

designing an integrated circuit device based on the minimum value for the goal function to produce an integrated circuit design.

17. The method of claim 16, further comprising forming an integrated circuit based on the integrated circuit design.

18. A computer readable medium storing a computer program comprising instructions to manipulate a processor, the instructions comprising instructions to:

receive a first weight associated with a goal function having an adjustable goal function value, the first weight indicating a relative importance of a hold time of a device under test;

receive a second weight associated with the goal function, the second weight indicating a relative importance of a setup time of the device under test, the goal function comprising a sum of the first weight times the hold time and the second weight times the setup time;

determine a minimum value for the goal function by iteratively adjusting the goal function value and testing the device under test based on the goal function value.

19. The computer readable medium of claim 18, wherein the instructions further comprise instructions to determine a minimum timing parameter value associated with the minimum goal function value, wherein the minimum timing parameter is one of a hold time and a setup time associated with the device under test.

20. The computer readable medium of claim 18, wherein the instructions to determine the minimum value for the goal function comprise instructions to:

iteratively adjust a goal function value by a first step size;

apply an input to the device under test having a setup and hold time associated with the goal function value;

in response to determining that an output of the device under test based on the input does not match a specified output, adjust a magnitude of the first step size.

* * * * *